US008513095B1

(12) United States Patent
Funcell et al.

(10) Patent No.: US 8,513,095 B1
(45) Date of Patent: Aug. 20, 2013

(54) METHOD AND SYSTEM FOR SEPARATING PHOTOVOLTAIC STRIPS

(75) Inventors: Alelie Funcell, Fremont, CA (US); Rick Briere, Santa Clara, CA (US); Douglas R. Battaglia, Jr., Campbell, CA (US)

(73) Assignee: Solaria Corporation, Fremont, CA (US)

( * ) Notice: Subject to any disclaimer, the term of this patent is extended or adjusted under 35 U.S.C. 154(b) by 1148 days.

(21) Appl. No.: 12/200,915

(22) Filed: Aug. 28, 2008

Related U.S. Application Data

(60) Provisional application No. 60/969,793, filed on Sep. 4, 2007.

(51) Int. Cl.
*H01L 31/0232* (2006.01)
*H01L 31/18* (2006.01)

(52) U.S. Cl.
USPC ........... 438/460; 438/461; 438/462; 438/463; 438/464; 136/243; 136/244; 136/245; 136/246; 136/247; 136/248; 136/249; 136/250; 136/251; 136/252

(58) Field of Classification Search
USPC .......................... 136/243–252; 438/460–464
See application file for complete search history.

(56) References Cited

U.S. PATENT DOCUMENTS

| | | | |
|---|---|---|---|
| 3,700,714 A | 10/1972 | Hamilton et al. | |
| 4,029,519 A | 6/1977 | Schertz et al. | |
| 4,091,798 A | 5/1978 | Selcuk | |
| 4,097,308 A | 6/1978 | Klein et al. | |
| 4,118,249 A | 10/1978 | Graven et al. | |
| 4,122,833 A | 10/1978 | Selcuk | |
| 4,143,234 A | 3/1979 | Johnson et al. | |
| 4,166,917 A | 9/1979 | Dorfeld et al. | |
| 4,170,507 A | 10/1979 | Keeling et al. | |
| 4,291,191 A | 9/1981 | Dahlberg | |
| 4,293,192 A | 10/1981 | Bronstein | |
| 4,295,463 A | 10/1981 | Citron | |
| 4,333,447 A | 6/1982 | Lemrow et al. | |
| 4,361,136 A | 11/1982 | Huang | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,511,618 A | 4/1985 | Duchene et al. | |
| 4,571,812 A | 2/1986 | Gee | |
| 4,589,191 A | 5/1986 | Green et al. | |
| 4,683,154 A | 7/1987 | Benson et al. | |
| 4,691,994 A | 9/1987 | Tveryanovich | |
| 4,848,319 A | 7/1989 | Appeldorn | |
| 4,863,224 A | 9/1989 | Tveryanovich | |
| 4,964,713 A | 10/1990 | Goetzberger | |
| 4,999,059 A | 3/1991 | Bagno | |
| 5,080,725 A | 1/1992 | Green et al. | |

(Continued)

*Primary Examiner* — Jennifer Michener
*Assistant Examiner* — Matthew Martin
(74) *Attorney, Agent, or Firm* — Richard T. Ogawa; Ogawa P.C.

(57) ABSTRACT

A method for manufacturing solar strips. The method includes providing a photovoltaic material including a back side region, a front side surface, and a plurality of photovoltaic strip regions separated by a plurality of scribe regions. A first portion of the photovoltaic material is supported while a second portion of the photovoltaic material including at least one of the photovoltaic strips is left unsupported. The method includes applying a predetermined force along a portion of the photovoltaic strip that remains unsupported to cause the photovoltaic strip to be separated from the supported photovoltaic material.

37 Claims, 12 Drawing Sheets

(56) References Cited

U.S. PATENT DOCUMENTS

| | | |
|---|---|---|
| 5,118,361 A | 6/1992 | Fraas et al. |
| 5,153,780 A | 10/1992 | Jorgensen et al. |
| 5,167,724 A | 12/1992 | Chiang |
| 5,174,275 A | 12/1992 | Holland |
| 5,240,510 A | 8/1993 | Goldade et al. |
| 5,245,985 A | 9/1993 | Holland |
| 5,261,970 A | 11/1993 | Landis et al. |
| 5,344,496 A | 9/1994 | Stern et al. |
| 5,356,488 A | 10/1994 | Hezel |
| 5,365,920 A | 11/1994 | Lechner |
| 5,395,070 A | 3/1995 | Wilk |
| 5,449,626 A | 9/1995 | Hezel |
| 5,460,659 A | 10/1995 | Krut |
| 5,466,301 A | 11/1995 | Hammerbacher et al. |
| 5,498,297 A | 3/1996 | O'Neill et al. |
| 5,517,339 A | 5/1996 | Riccobono et al. |
| 5,529,054 A | 6/1996 | Shoen |
| 5,542,409 A | 8/1996 | Sampayo |
| 5,564,411 A | 10/1996 | Gerics |
| 5,660,644 A | 8/1997 | Clemens |
| 5,707,459 A | 1/1998 | Itoyama et al. |
| 5,735,966 A | 4/1998 | Luch |
| 5,782,993 A | 7/1998 | Ponewash |
| 5,787,878 A | 8/1998 | Ratliff, Jr. |
| 5,790,304 A | 8/1998 | Sanders et al. |
| 5,851,309 A | 12/1998 | Kousa |
| 5,865,905 A | 2/1999 | Clemens |
| 5,877,874 A | 3/1999 | Rosenberg |
| 5,882,434 A | 3/1999 | Horne |
| 5,936,777 A | 8/1999 | Dempewolf |
| 5,959,787 A | 9/1999 | Fairbanks |
| 5,964,216 A | 10/1999 | Hoffschmidt et al. |
| 5,994,230 A * | 11/1999 | Huntoon .................. 438/705 |
| 6,008,449 A | 12/1999 | Cole |
| 6,049,035 A | 4/2000 | Tsuri et al. |
| 6,057,505 A | 5/2000 | Ortabasi |
| 6,091,017 A | 7/2000 | Stern |
| 6,091,020 A | 7/2000 | Fairbanks et al. |
| 6,107,564 A | 8/2000 | Aguilera et al. |
| 6,118,067 A | 9/2000 | Lashley et al. |
| 6,134,784 A | 10/2000 | Carrie et al. |
| 6,167,724 B1 | 1/2001 | Pozivil |
| 6,274,402 B1 | 8/2001 | Verlinden et al. |
| 6,274,860 B1 | 8/2001 | Rosenberg |
| 6,294,723 B2 | 9/2001 | Uematsu et al. |
| 6,309,901 B1 | 10/2001 | Tahon et al. |
| 6,323,415 B1 | 11/2001 | Uematsu et al. |
| 6,333,457 B1 | 12/2001 | Mulligan et al. |
| 6,337,283 B1 | 1/2002 | Verlinden et al. |
| 6,387,726 B1 | 5/2002 | Verlinden et al. |
| 6,423,568 B1 | 7/2002 | Verlinden et al. |
| 6,429,037 B1 | 8/2002 | Wenham et al. |
| 6,433,913 B1 | 8/2002 | Bauer et al. |
| 6,440,769 B2 | 8/2002 | Peumans et al. |
| 6,479,744 B1 | 11/2002 | Tsuzuki et al. |
| 6,528,716 B2 | 3/2003 | Collette et al. |
| 6,528,718 B2 | 3/2003 | Yoda et al. |
| 6,583,032 B1 * | 6/2003 | Ishikawa et al. .............. 438/462 |
| 6,612,705 B1 | 9/2003 | Davidson et al. |
| 6,619,282 B1 | 9/2003 | Murtha |
| 6,620,995 B2 | 9/2003 | Vasylyev et al. |
| 6,666,207 B1 | 12/2003 | Arkas et al. |
| 6,676,263 B2 | 1/2004 | Winston |
| 6,700,054 B2 | 3/2004 | Cherney et al. |
| 6,700,055 B2 | 3/2004 | Barone |
| 6,804,062 B2 | 10/2004 | Atwater et al. |
| 6,843,573 B2 | 1/2005 | Rabinowitz et al. |
| 6,849,797 B2 | 2/2005 | Koyanagi et al. |
| 2002/0007845 A1 | 1/2002 | Collette et al. |
| 2002/0018308 A1 | 2/2002 | Winston |
| 2002/0075579 A1 | 6/2002 | Vasylyev et al. |
| 2002/0139414 A1 | 10/2002 | Vasylyev et al. |
| 2003/0015233 A1 | 1/2003 | Barone |
| 2003/0037814 A1 | 2/2003 | Cohen et al. |
| 2003/0081333 A1 | 5/2003 | Winston |
| 2003/0095340 A1 | 5/2003 | Atwater et al. |
| 2003/0121542 A1 | 7/2003 | Harneit et al. |
| 2003/0156337 A1 | 8/2003 | Davidson et al. |
| 2003/0201007 A1 | 10/2003 | Fraas et al. |
| 2004/0016454 A1 | 1/2004 | Murphy et al. |
| 2004/0021964 A1 | 2/2004 | Rabinowitz et al. |
| 2004/0084077 A1 | 5/2004 | Aylaian |
| 2004/0097012 A1 | 5/2004 | Weber et al. |
| 2004/0123895 A1 | 7/2004 | Kardauskas et al. |
| 2004/0134531 A1 | 7/2004 | Habraken et al. |
| 2004/0194820 A1 | 10/2004 | Barone |
| 2004/0243364 A1 | 12/2004 | Wendelin et al. |
| 2004/0246605 A1 | 12/2004 | Stiles et al. |
| 2005/0070059 A1 | 3/2005 | Blakers et al. |
| 2005/0081908 A1 | 4/2005 | Stewart |
| 2005/0081909 A1 | 4/2005 | Paull |
| 2005/0087294 A1 | 4/2005 | Rabinowitz |
| 2006/0054211 A1 | 3/2006 | Meyers |
| 2007/0099396 A1 * | 5/2007 | Hirai et al. .................. 438/460 |
| 2008/0070378 A1 * | 3/2008 | Yeo .................. 438/460 |
| 2008/0223429 A1 * | 9/2008 | Everett et al. .................. 136/244 |

* cited by examiner

406

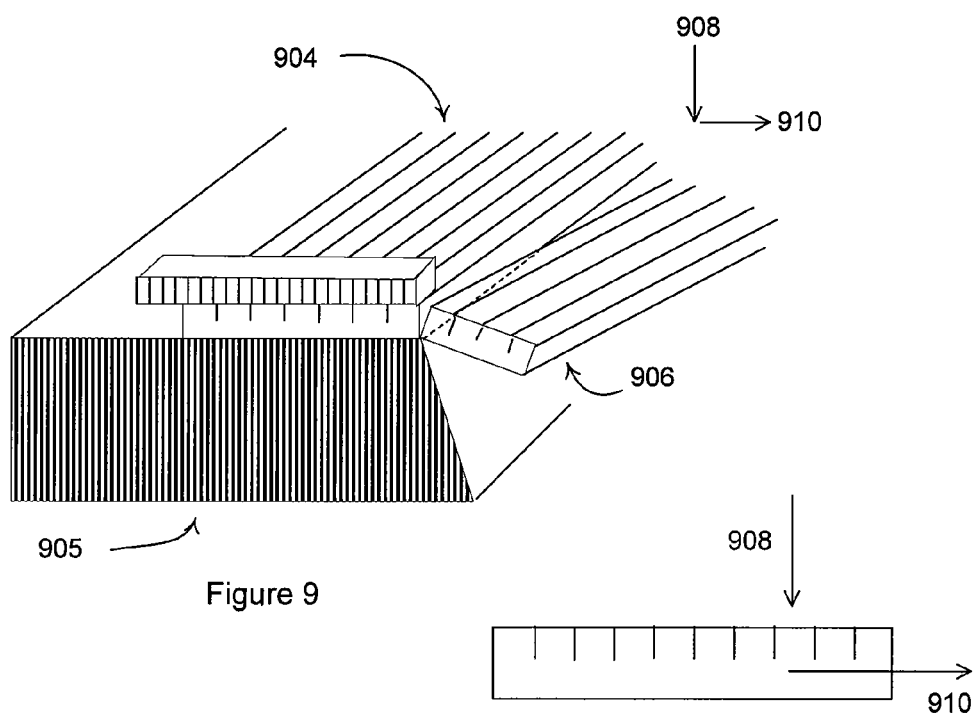
Figure 9
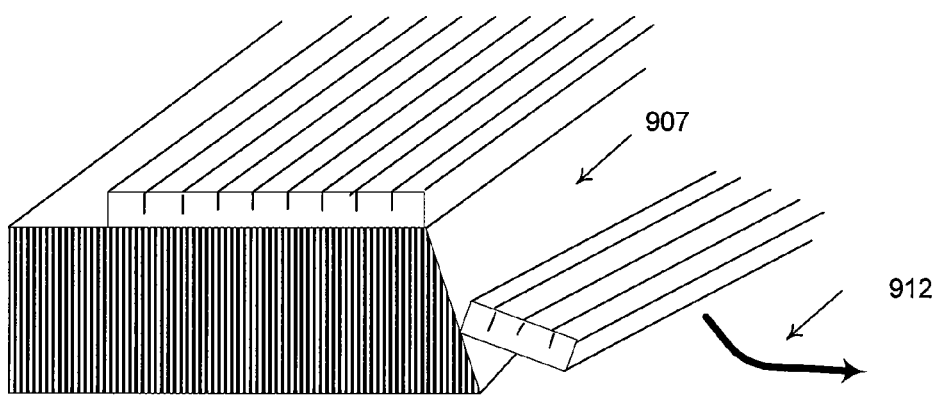

METHOD AND SYSTEM FOR SEPARATING PHOTOVOLTAIC STRIPS

CROSS-REFERENCES TO RELATED APPLICATIONS

This application claims priority to U.S. Provisional Patent Application No. 60/969,793, filed Sep. 4, 2007, commonly assigned, incorporated herein by reference for all purposes.

BACKGROUND OF THE INVENTION

The present invention relates generally to solar energy techniques. In particular, the present invention provides a method and resulting device fabricated from a plurality of photovoltaic regions provided within a photovoltaic material. More particularly, embodiments according to the present invention provide a method and resulting device for separating photovoltaic strips from a photovoltaic material. Merely by way of example, embodiments according to the present invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving fabricating solar devices is highly desirable.

BRIEF SUMMARY OF THE INVENTION

According to embodiments of the present invention, a method and a system to separate photovoltaic strips from a photovoltaic material is provided. More particularly, embodiments according to the present provide a method and a system to separate photovoltaic strips from the photovoltaic material that are free from defects in the P-N junction. In a specific embodiment, each of the photovoltaic strips is further assembled into P-V modules and P-V panels. But it would be recognized that embodiments according to the present invention have a much broader range of applicability. For example, the method can be applied to semiconductor device packaging among others.

In a specific embodiment, a method for manufacturing solar strips is provided. The method includes providing a photovoltaic material. The photovoltaic material includes a back side region and a front side surface. In a specific embodiment, the photovoltaic material includes a plurality of photovoltaic strip regions numbered from 1 through N, N being an integer greater than 5 in a preferred embodiment. In a specific embodiment, each of the photovoltaic strip regions is separated by a scribe region provided in the front side surface of the photovoltaic material. For example, the scribe region may be provided in a portion of the photovoltaic material using a partial cut through a thickness in the front side surface of the photovoltaic material in a specific embodiment. According to an embodiment, the depth of the partial cut may range from a range of 35% to 95% of the depth of the photovoltaic material. The method includes supporting a first portion of the photovoltaic material and allowing at least a second portion of the photovoltaic material unsupported. The method includes applying a predetermined force along a length of one or more of the photovoltaic strip regions that remains unsupported. The force causes the one or more photovoltaic strip regions to be separated and removed from the supported photovoltaic material in a specific embodiment.

Numerous benefits can be achieved by ways of the present invention over existing techniques. In particular, embodiments according to the present invention use a method and a system that provide photovoltaic strips to further assembled into solar modules and photovoltaic systems. In a preferred embodiment, the method provides a scribe region in a portion of the photovoltaic material to allow for the separation of one or more photovoltaic strips from the photovoltaic material.

Preferably, each of the photovoltaic strip as well as the remaining photovoltaic material are free from defects.

Depending on the embodiment, one or more of these benefits may be achieved. These and other benefits are described throughout the present specification and particularly below.

BRIEF DESCRIPTION OF THE DRAWINGS

FIG. 9 is a simplified diagram illustrating an alternative method of separating photovoltaic strips from photovoltaic material according to an embodiment of the present invention

DETAILED DESCRIPTION OF THE INVENTION

According to embodiments of the present invention, a method and a system to separate photovoltaic strips from a scribed photovoltaic material is provided. Conventional method of separating devices, for example, in semiconductor industry can include a sawing process, or a laser cut process, among others. Such processes invariably cause kerf loss and possibly cracking and chipping in the scribed photovoltaic material. In addition, such process may cause delamination of conductor layer(s) from a scribed photovoltaic material and are not adequate or cost effective in separating scribed photovoltaic materials. Accordingly, embodiments according to the present invention provide a method and a system to separate photovoltaic strips from the scribed photovoltaic material that are free from defects in, for example, P-N junction, interface regions (e.g., contact regions), and others. Preferably the method provides a cost effective way to provide photovoltaic strips to be further assembled into P-V modules and P-V panels.

In a specific embodiment, a method of separating a photovoltaic strip from a scribed photovoltaic material may be outlined as follow:

1. Provide scribed photovoltaic material, where the scribed photovoltaic material includes a front side surface, a back side region, and a plurality of photovoltaic strip regions separated by a plurality of scribe regions;

2. Support a first portion of the scribed photovoltaic material and leaving a second portion of the scribed photovoltaic material unsupported, where the second portion separated from the first portion by a scribe region and where the second portion includes at least one photovoltaic strip region;

3. Apply a force (for example, a shear force, a breaking force) along the length of the second (unsupported) portion, the length being parallel to the length of the scribe region, and causing the second portion to be separated from the first portion;

4. Maneuver and align the scribed photovoltaic material such that a portion of the remaining scribed photovoltaic material is supported and a portion of the remaining scribed photovoltaic material is left unsupported.

5. Remove the separated photovoltaic regions for further processing;

6. Repeat the above steps until all the rest of the scribed photovoltaic material has been consumed;

7. Perform other steps as needed.

The above sequence of steps provides a method for separating photovoltaic strips in a scribed photovoltaic material, where the separate strips can be assembled into photovoltaic modules.

Figure 1:
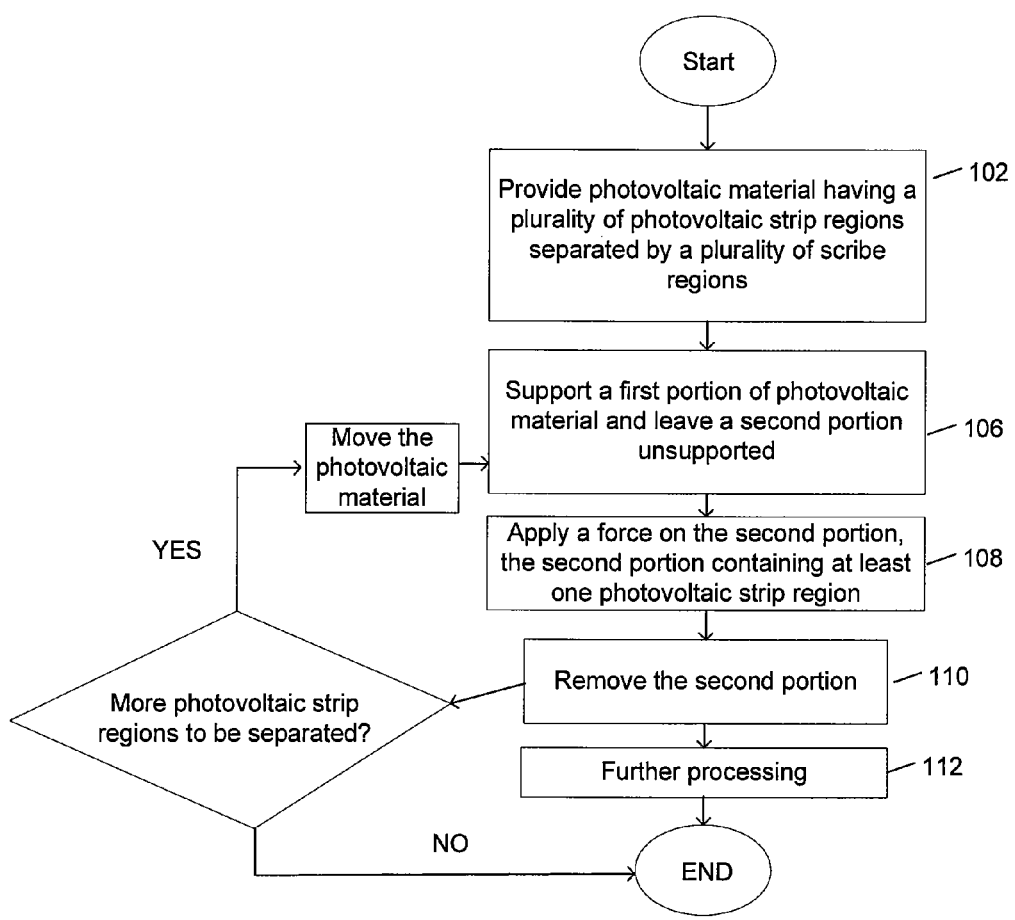
FIG. 1 is a simplified flow diagram illustrating a method for separating photovoltaic strips from photovoltaic material according to an embodiment of the present invention.

FIG. 1 is a simplified flow diagram illustrating a method and system of separating photovoltaic strips from a scribed photovoltaic material according to an embodiment of the present invention. The method includes providing a scribed photovoltaic material that includes a plurality of photovoltaic strip regions and a plurality of scribe regions. According to an embodiment, each of the plurality of photovoltaic strips is separated from each other by a scribe region.

To process and separate the plurality of photovoltaic strips, the scribed photovoltaic material is maneuvered and aligned such that a first portion of the scribed photovoltaic material is provided on a support while a second portion is left unsupported. The second portion is separated from the first by a scribe region and can include one or more photovoltaic strips. The second portion of the scribed photovoltaic material is subjected to a force along a direction parallel to the length of one of the photovoltaic strips or scribe regions. The force causes the second portion to be separated from the first portion of the scribed photovoltaic material. The separated scribed photovoltaic material is then removed for further processing. The remaining portions of the original scribed photovoltaic material on the supporting material is subjected to the above separation steps to detach further a plurality of separated scribed photovoltaic materials. Other alternatives may also be provided where steps are added, re-ordered, removed, or substituted without departing from the scope of the claims herein. Further details of the present method can be found throughout the present specification and more particularly below.

FIGS. 2-8 are simplified diagrams illustrating methods of separating one or more photovoltaic strips from a scribed photovoltaic material according to an embodiment of the present invention. These diagrams are merely examples and should not unduly limit the scope of the present invention. One skilled in the art would recognize many other variations, modifications, and alternatives.

Figure 2:
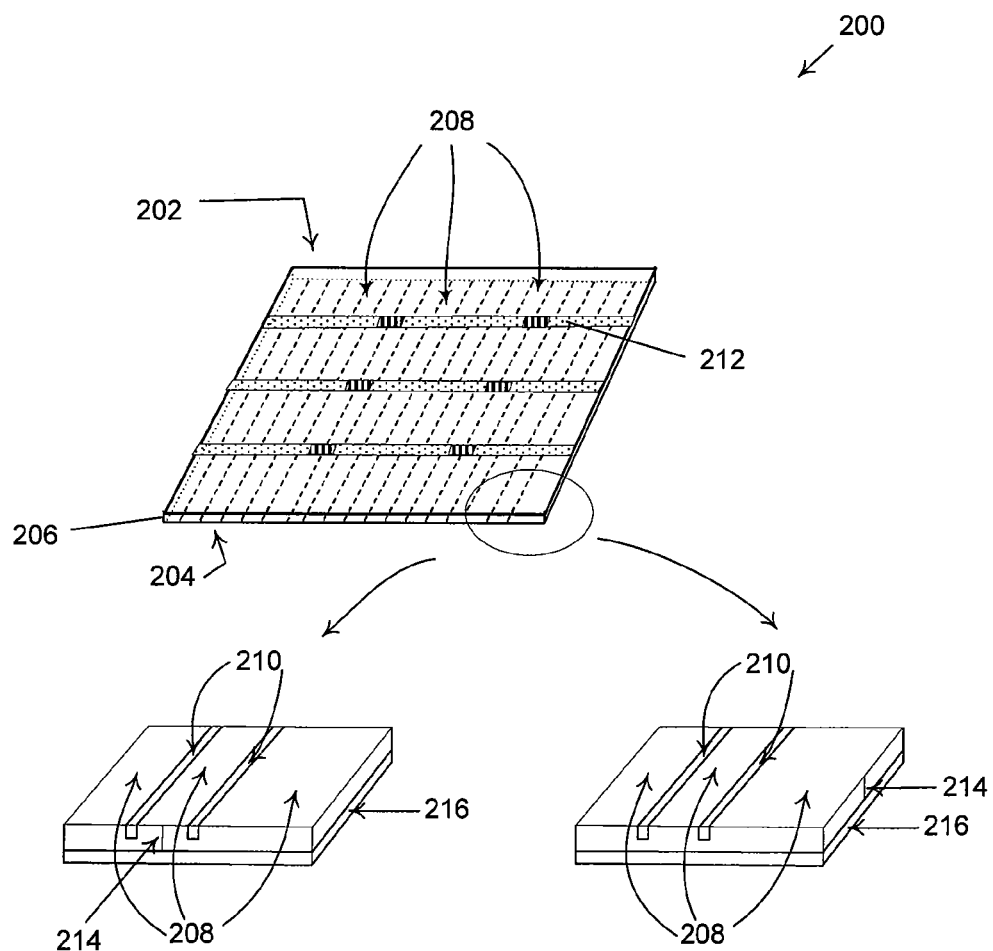
FIGS. 2-8 are simplified diagrams illustrating a method of separating photovoltaic strips from photovoltaic material according to an embodiment of the present invention.

FIG. 2 shows an exemplary scribed photovoltaic material. According to an embodiment, a scribed photovoltaic material 200 is provided. The scribed photovoltaic material includes a front surface region 202, a back surface region 204, and a thickness 206. The scribed photovoltaic material includes a plurality of photovoltaic strip regions 208. The plurality of photovoltaic strip regions 208 are separated by a plurality of scribe regions 210. In a specific embodiment, each of the photovoltaic strip regions is characterized by a width of about 2 mm to about 3 mm and a length of about 100 mm-150 mm. According to an embodiment, each of the plurality of scribe regions extends to a depth of about 30%-90% of the thickness of the scribed photovoltaic material from the front surface region.

Scribed photovoltaic material 200 may also include conductor regions 212 overlying portions of front surface region 202. Conductor regions 212 may be provided using a suitable metal layer such as a silver alloy, an aluminum alloy, or a combination. Each photovoltaic strip region includes at least one P-N junction 214. According to one embodiment, each strip region one P-N junction in a portion of the thickness of the scribed photovoltaic material that divides each photovoltaic strip along the length the strip. According to another embodiment, each strip region one P-N junction in a portion of the thickness of the scribed photovoltaic material that divides each photovoltaic strip along the width the strip. A passivation layer 216 is provided overlying back surface region 204 of a scribed photovoltaic material. An exemplary passivation layer 216 include materials such as silicon nitride. Depending on the embodiment, there can be other variations, modifications, and alternatives.

Figure 3:
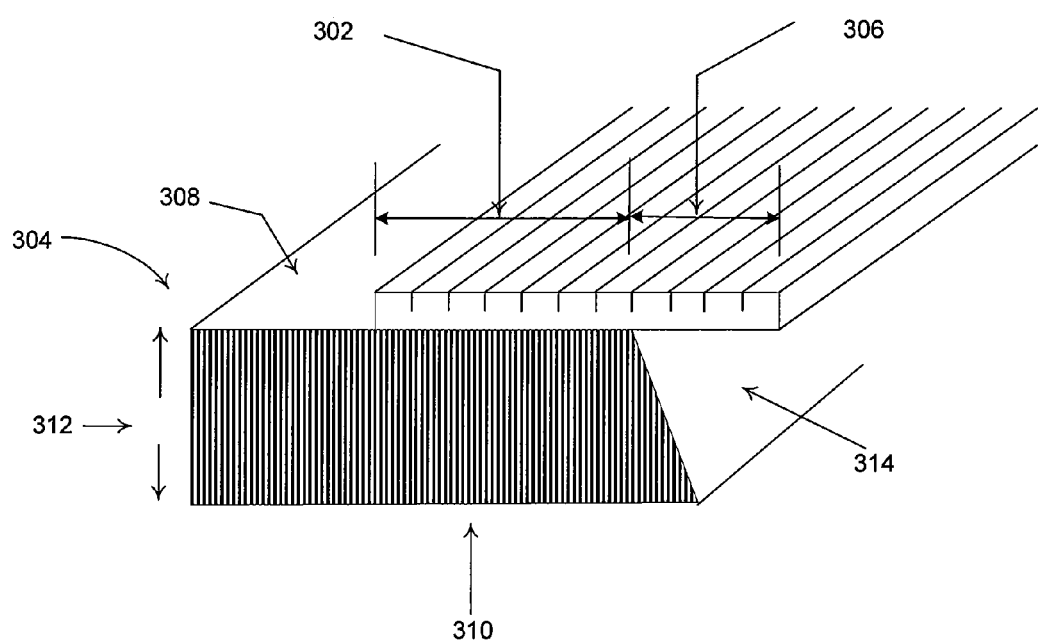

FIG. 3 shows an exemplary configuration how a scribed photovoltaic material is processed. According to an embodiment, a first portion 302 of the scribed photovoltaic material is provided on a support member 304 while a second portion 306 of the scribed photovoltaic material including one or more photovoltaic strips is allowed to be unsupported. In a specific embodiment, the front side of the scribed photovoltaic material including the plurality of scribe regions is exposed as shown in FIG. 3. Support member 304 has a top surface 308, a back surface 310, a thickness 312, and a side surface 314 provided at an oblique angle. The support member may be made of a metal material, an alloy, a plastic material, or a rubber material. In a specific embodiment, support member 304 is made of an aluminum. In an alternate embodiment, the support member may be made of nickel plated aluminum. Of course there can be other variations, modifications, and alternatives.

Figure 4A:
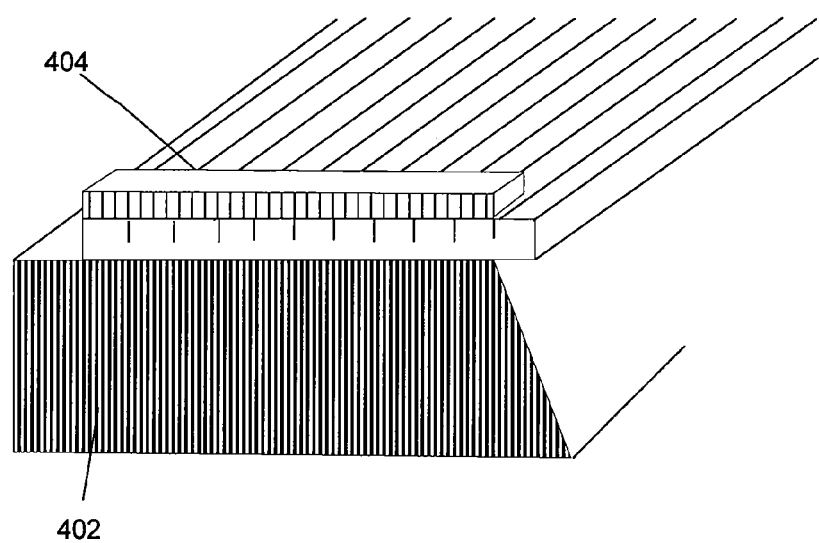

FIG. 4 shows two exemplary configurations of several members used in the method and system for separating one or more photovoltaic strip regions in a scribed photovoltaic material. In a specific embodiment shown in FIG. 4A, a clamp member 404 is used to provide a mechanical clamping force that maintains the scribed photovoltaic material substantially flat against support member 402. In the embodiment, a tape is not required to hold the scribed photovoltaic material and the support member together. Of course there can be other variations, modifications, and alternatives.

Figure 4B:
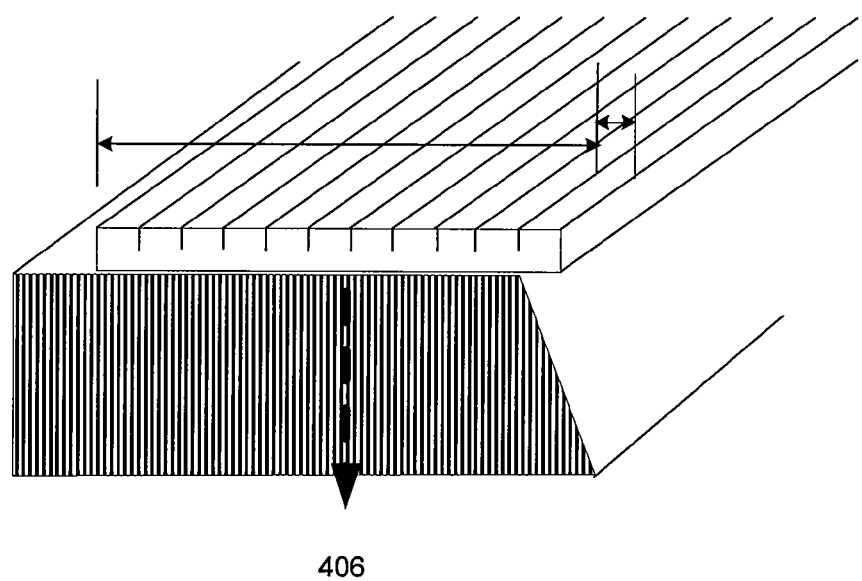

FIG. 4B shows another exemplary configuration of several members used in the method and system for separating one or more photovoltaic strip regions in a scribed photovoltaic material. According to the embodiment, a vacuum 406 is applied to the backside surface of the scribed photovoltaic material to hold the scribed photovoltaic material flat against supporting the member. In the embodiment, a tape is not required to hold the scribed photovoltaic material and the support member together. Of course there can be other variations, modifications, and alternatives.

Figure 5A:
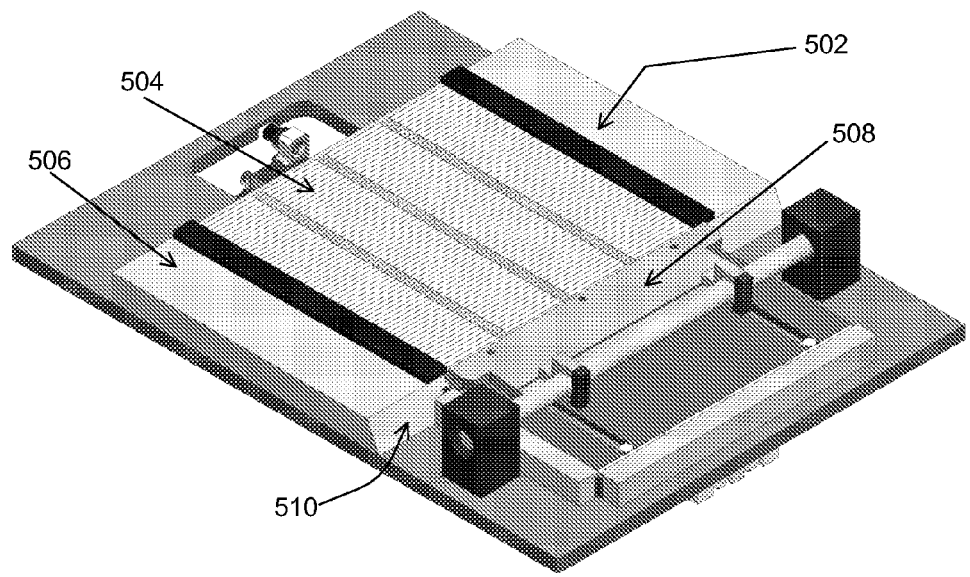

FIG. 5A shows an exemplary method and system 500 for processing scribed photovoltaic materials to produce separated photovoltaic strips. System 500 includes a clamp 502 for holding a scribed photovoltaic material 504 against a support material 506. The scribed photovoltaic material 504 is positioned on support material 506 such that a portion of the scribed photovoltaic material is supported by support material 506 and a portion is left unsupported and hanging over support material 506. A hammer-like device 508 is brought to exert a predetermined force on the unsupported portion of the scribed photovoltaic material 504 such that the unsupported portion is separated from the supported portion.

Figure 5B:
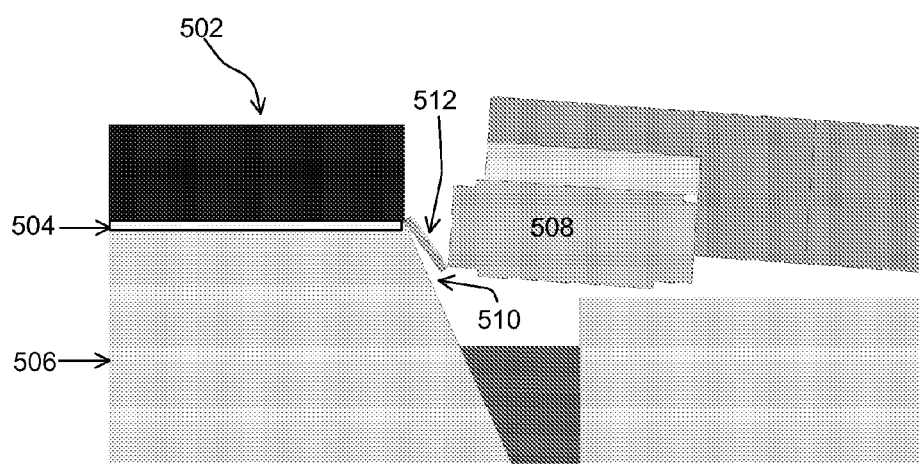

FIG. 5B shows in more detail an exemplary process by which a unsupported portion is separated from a scribed photovoltaic material 504. According to an embodiment, a hammer-like device 508 is brought upon an unsupported portion to exert a predetermined force on the unsupported portion. The force causes unsupported portion to be separated from the rest of the photovoltaic material along a scribe separating unsupported portion from the rest of the photovoltaic material. Detached portion 512 is then guided and moved away along an oblique or incline section 510 of support member 506. In a preferred embodiment, detached portion 512 is guided away by gravity without flipping over. Hammer-like device 508 exerts a force that preferably does not have a component pushing unsupported region 512 into the rest of scribed photovoltaic material 510. According to an embodiment, the substantially reduces the risk of the scribed photovoltaic material cracking or chipping during and after the application of the predetermined force.

Figure 6:
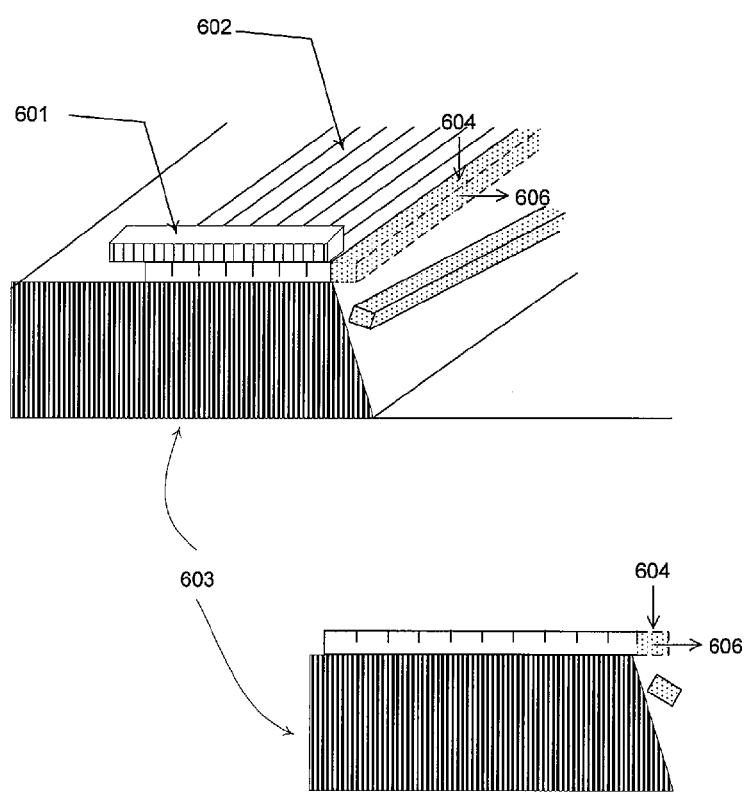

FIG. 6 shows in more detail how a photovoltaic strip is held and separated from a scribed photovoltaic material. According to an embodiment, a clamp 601 is provided to hold a scribed photovoltaic material 602 against a support member 603. A portion of the scribed photovoltaic material is supported and held substantially flat on the support member 603 while another portion is left unsupported and hanging over support member 603. A hammer-like device is brought to apply a force against the unsupported portion of scribed photovoltaic material 602. According to an embodiment, the force does not include a component that pushes the unsupported portion of the scribed photovoltaic material into the supported portion of the scribed photovoltaic material. Preferably, the force includes a component 604 normal to the plane of the scribed photovoltaic material to cause the unsupported portion to shear away and separate from the supported portion. Preferably, the force also includes a component 606 that pulls the unsupported portion of the scribed photovoltaic material from the supported portion of the scribed photovoltaic material.

An exemplary force applied along the length of a photovoltaic strip causes the unsupported one or more photovoltaic strips to be separated from the scribed photovoltaic material alone the length of a scribe region, as described above. In an embodiment, the separation of the one or more photovoltaic strips from the scribed photovoltaic material occur along a scribed region. The separation may also occur along a crystal plane within the scribed photovoltaic material. In a specific embodiment, the force is applied within a predetermined time period. The predetermined time period may range from a first value to a second value capable for efficient manufacturing according to a specific embodiment. The velocity of hammer-like device applying the predetermined force may range from a first value to a second value, but no greater than an amount capable of causing damage to any of the strips according to a specific embodiment According to an embodiment, additional processes may the separation process. According to an embodiment, Nitrogen is applied to cold freeze the scribed photovoltaic material before the pre-determined force is applied. According to another embodiment, a flow of Oxygen may also be applied. According to yet another embodiment, a strong water flow may be provided over the scribed photovoltaic material.

According to an embodiment, the force applied the scribed photovoltaic material causes a clean and complete separation of the unsupported photovoltaic strip regions from the scribed photovoltaic material. The one or more conductor regions, the photovoltaic strip regions, and the P-N junctions are also not damaged during the separation process. Additionally, interface region such as that between the conductor material and the scribed photovoltaic material also remains intact and undamaged. In an embodiment, the force applied also causes the one or more separated photovoltaic strips to travel along oblique side surface 608. According to an embodiment, the detached photovoltaic strips is moved along oblique side surface 608 by gravity. The detached photovoltaic strips preferably moves in a right-side-up position, without flipping.

Figure 7:
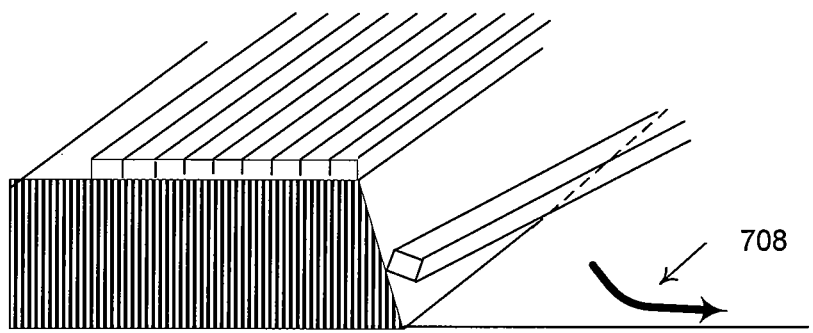

FIG. 7 shows the process by which a detached photovoltaic strip is removed from the support member in more detail. According to an embodiment, a separated photovoltaic strip region may be removed using a walking beam, a roller, a belt system, a robotic arm, or others. Preferably, the separated photovoltaic strip region is moved in an upright orientation, without flipping. Of course there can be other variations, modifications, and alternatives.

Figure 8:
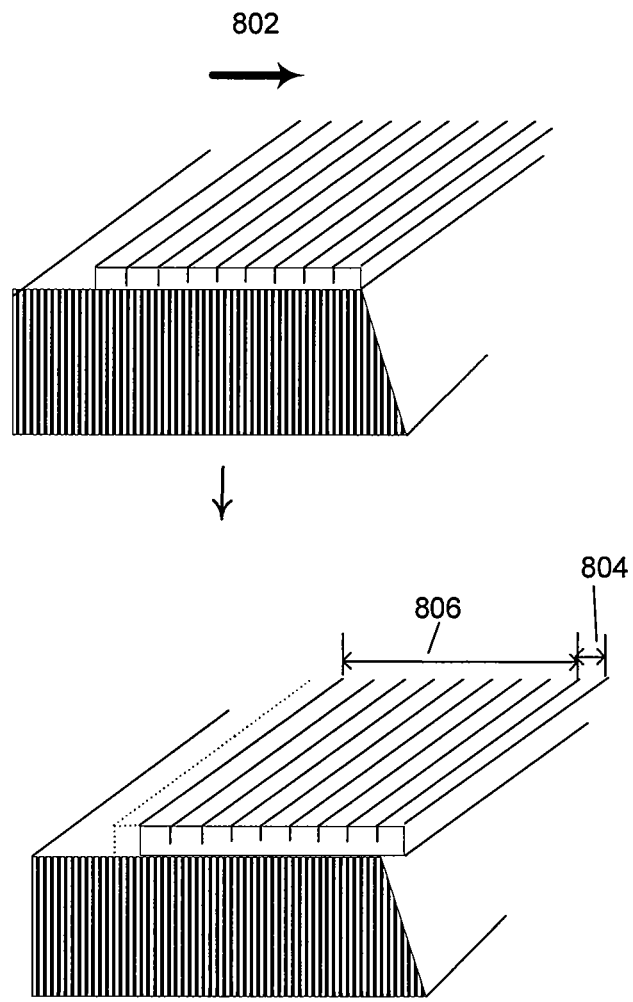

FIG. 8 shows an exemplary process by which a scribed photovoltaic member with a portion detached is repositioned such that a new portion can be detached. According to an embodiment, after a portion of a scribed photovoltaic material is detached, the remaining scribed photovoltaic material is moved 802 by a distance of a multiple of the width of a photovoltaic strip region. This exposes a new portion 804 of one or more photovoltaic strips that is unsupported. Unsupported portion 804 can be subjected to another force which causes it to be separated from supported portion 806. The process of moving the scribed photovoltaic material to expose a new portion for separation is repeated until the scribed photovoltaic material is exhausted. Of course there can be other variations, modifications, and alternatives.

FIG. 9 shows an exemplary process by which a plurality of photovoltaic strips are separated from a scribed photovoltaic material. According to an embodiment, a scribed photovoltaic material is held against a support member 905. A first portion 904 of the scribed photovoltaic material is supported by support member 905 while a second portion 602, containing a plurality of strip regions, is left unsupported and hanging over support member 905.

A hammer-like device is next brought to apply a force against the second portion of the scribed photovoltaic material. According to an embodiment, the force contains a component 908 normal to the plane of the scribed photovoltaic material. The normal component causes the unsupported portion to shear away and separate from the supported portion. According to a specific embodiment, the force also includes a tangential component 910. The tangential component pulls the second (unsupported) portion of the scribed photovoltaic material from the first (supported) portion of the scribed photovoltaic material along the plane of the scribed photovoltaic material. Care is taken to ensure that the tangential component does not push the second (unsupported) portion of the scribed photovoltaic material from the first (supported) portion of the scribed photovoltaic material. Such a pushing force may cause the photovoltaic material to crack or chip. The separated portion contains a plurality of photovoltaic strips and are transported 912 along the oblique or incline face 907 of support member 905. The separated portion preferably is moved along the incline in an upright position without flipping.

Figure 10:
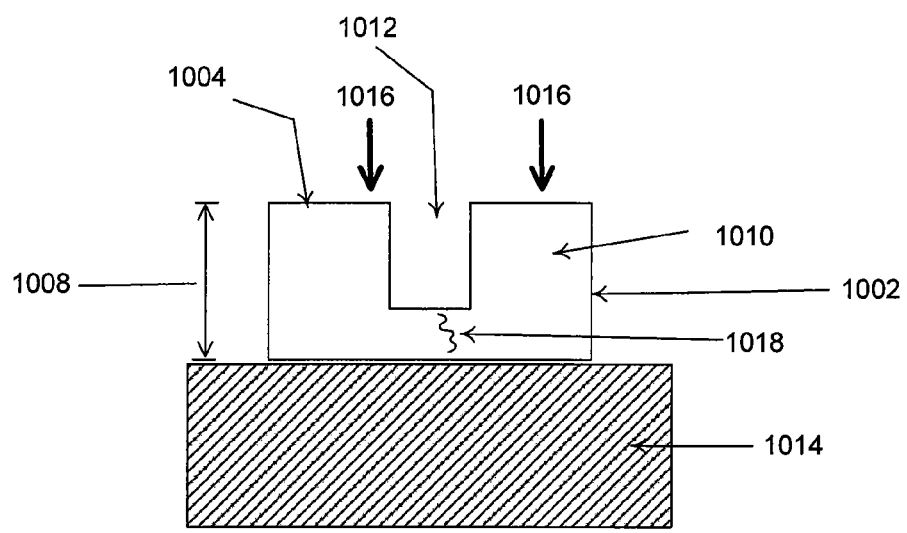
FIG. 10 is a simplified diagram illustrating another exemplary process by which a scribed photovoltaic material may be processed according to an embodiment of the present invention.

FIG. 10 shows another exemplary process by which a scribed photovoltaic material may be processed. According to another embodiment, a scribed photovoltaic material 1002 is placed on a flexible material 1014. Scribed photovoltaic material 1002 includes a scribe region 1012 and two photovoltaic strip regions 1004 and 1010, with photovoltaic strip regions 1004 and 1010 separated by scribe region 1012. Scribed photovoltaic material 1002 has a depth 1008, of which only a part is penetrated by scribed region 1012. According to an embodiment, when a pair of external forces 1016 are applied on the pair of photovoltaic strip regions 1004 and 1010, a break 918 forms on a portion of photovoltaic material where the thickness of the photovoltaic material has been reduced by scribed region 912. The resulting break causes photovoltaic strip regions 1004 and 1010 to be separated from each other.

Figure 11:
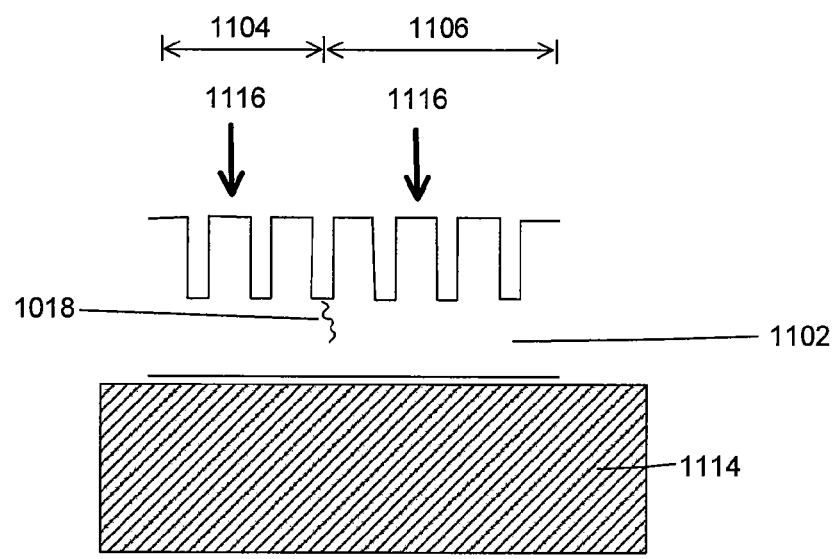
FIG. 11 is a simplified diagram illustrating another exemplary process by which a scribed photovoltaic material may be processed according to an embodiment of the present invention.

FIG. 11 shows another exemplary process by which a scribed photovoltaic material may be processed. According to an embodiment, a scribed photovoltaic material 1102 is placed on a flexible material 1114. A pair of external forces 1116 are applied on a pair of photovoltaic strips that need not be adjacent to each other. When the pair of external forces are applied, the forces cause photovoltaic material 1102 to separate into two portions 1104 and 1106 as shown.

While the above is a full description of specific embodiments, various modifications, alternatives, and equivalents may be used. The above has been described using a selected sequence of steps. It is noted that any combination of any elements of steps described as well as others may be used. Additionally, certain steps may be added and/or combined, and/or eliminated depending upon the embodiment. For example, the clamping process may be modified to include other mechanism to prevent shattering of the scribed photovoltaic material. In addition, the force to cause separation may be provided by applying other distributed force along the photovoltaic strip region. Other ways to separate the photovoltaic strip region from the scribed photovoltaic material may include a cold freeze, a shearing force or an air knife depending on the embodiment. The number of photovoltaic strips in the photovoltaic strip regions to be separated may also vary depending on the embodiment. Of course there can be other variations, modifications, and alternatives. Therefore the above description and illustrations should not be taken as limiting the scope of the present invention which is defined by the appended claims.

What is claimed is:

1. A method for manufacturing solar strips, the method comprising:

providing a photovoltaic material having a thickness, the photovoltaic material including a backside surface and a front side, a plurality of photovoltaic strip regions having at least five strip regions, a plurality of scribe regions separating the plurality of photovoltaic strip regions, wherein a scribe region from the plurality of scribe regions includes a depth, the depth being less than the thickness of the photovoltaic material, the scribe region dividing the photovoltaic material into a first portion and a second portion of the photovoltaic material;

providing a support material;

positioning the photovoltaic material such that the first portion is supported by the support material and the second portion is unsupported by the support material, the second portion including at least one photovoltaic strip region;

applying a pre-determined force comprising a sheer force and a break force along the second portion to cause the second portion to be separated from the first portion;

moving a remaining portion of the photovoltaic material by a distance of an integer multiple of a width of a photovoltaic strip region such that a third portion of the photovoltaic material is supported by the support material and a fourth portion of the photovoltaic material is unsupported by the support material, wherein the fourth portion includes at least one photovoltaic strip region;

applying a pre-determined force along the fourth portion to cause the fourth portion to be separated from the third portion; and repeating moving and applying the pre-determined force to any remaining portions of the photovoltaic material until the remaining portions have been exhausted, wherein the plurality of photovoltaic strip regions are parallel to each other.

2. The method of claim 1 wherein the pre-determined force is substantially free of a component that pushes the second portion into the first portion.

3. The method of claim 1 wherein the pre-determined force includes a component that pulls the second portion away from the first portion.

4. The method of claim 1 wherein the pre-determined force includes a component that causes the second portion to shear away from the first portion along the scribe region.

5. The method of claim 1 wherein the pre-determined force includes a distributed force.

6. The method of claim 1 wherein the pre-determined force includes a component that causes the second portion to shear away from the first portion along a crystal plane in the photovoltaic material.

7. The method of claim 1 further comprising producing a detached photovoltaic member and moving the detached photovoltaic member along the support member.

8. The method of claim 7 further comprising removing the detached photovoltaic member with an external device.

9. The method of claim 8 wherein the external device includes a pick.

10. The method of claim 7 wherein the detached photovoltaic member moves along the support member in an upright manner.

11. The method of claim 7 wherein the detached photovoltaic member moves along the support member without flipping over.

12. The method of claim 1 wherein the depth of each of the plurality of scribe regions ranges from about 30 to about 90 percent of the thickness of the photovoltaic material.

13. The method of claim 1 wherein the depth of each of the plurality of scribe regions is the same.

14. The method of claim 1 wherein the width of each of the plurality of scribe regions ranges is the same.

15. The method of claim 1 wherein the plurality of photovoltaic strip regions has a characteristic width, the method further comprising moving the photovoltaic material by an integer multiple of the characteristic width.

16. The method of claim 14 wherein the characteristic width is the width of a photovoltaic strip region, wherein the width of each of the plurality of scribe regions ranges is similar.

17. The method of claim 1 wherein positioning the photovoltaic material includes:
    placing the photovoltaic material on a top surface of the support member such that at least a portion of the backside surface of the photovoltaic material faces the top surface of the support member; and
    applying a force to the first portion such that at least a portion of backside surface of the photovoltaic material is substantially flush with the top surface.

18. The method of claim 17 wherein the applying of the force to the first portion includes providing a vacuum on a portion of the backside surface.

19. The method of claim 17 wherein the applying of the force to the first portion does not require the use of a tape.

20. The method of claim 17 wherein the applying of the force to the first portion includes clamping the photovoltaic material to the support material.

21. The method of claim 17 wherein the applying of the force to the first portion includes applying a distributed force to the front side surface.

22. The method of claim 1 further comprising providing a hammer-like device to apply the pre-determined force.

23. The method of claim 1 wherein the pre-determined force does not cause kerf loss in the photovoltaic material.

24. The method of claim 1 wherein the photovoltaic material includes at least one metal layer and at least one passivation layer.

25. The method of claim 1 wherein each of the plurality of photovoltaic strip regions includes at least one P-N junction.

26. The method of claim 25 wherein each of the at least one P-N junction divides each of the photovoltaic strip regions into at least one set of P-N regions along a length of each of the plurality of photovoltaic strip regions.

27. The method of claim 25 wherein each of the at least one P-N junction divides each of the plurality of photo voltaic strip regions into at least one set of P-N regions normal to a length of each of the plurality of photovoltaic strip regions.

28. The method of claim 25 wherein the at least one metal layer is located on the back side region of the photovoltaic material.

29. The method of claim 25 wherein the at least one P-N junction remains free of defect before and after the application of the pre-determined force.

30. The method of claim 25 wherein the at least one metal layer remains free of defect before and after the application of the pre-determined force.

31. The method of claim 25 wherein the at least one passivation layer remains free of defect before and after the application of the pre-determined force.

32. The method of claim 25 further comprising providing an oxygen flow over the photovoltaic material.

33. The method of claim 25 further comprising providing a nitrogen flow over the photovoltaic material.

34. The method of claim 25 further comprising providing a water flow over the photovoltaic material.

35. A method for manufacturing solar strips, the method comprising:
    providing a photovoltaic material having a thickness, the photovoltaic material including a backside surface and a front side, a plurality of photovoltaic strip regions having at least five strip regions, a plurality of scribe regions separating the plurality of photovoltaic strip regions, wherein a scribe region from the plurality of scribe regions includes a depth, the depth being less than the thickness of the photovoltaic material, the scribe region dividing the photovoltaic material into a first portion and a second portion of the photovoltaic material;
    providing a support material;
    positioning the photovoltaic material such that the first portion is supported by the support material and the second portion is unsupported by the support material, the second portion including at least one photovoltaic strip region;
    applying a pre-determined force along the second portion to cause the second portion to be separated from the first portion;
    moving a remaining portion of the photovoltaic material by a distance of an integer multiple of a width of a photovoltaic strip region such that a third portion of the photovoltaic material is supported by the support material and a fourth portion of the photovoltaic material is unsupported by the support material, wherein the fourth portion includes at least one photovoltaic strip region;
    applying a pre-determined force along the fourth portion to cause the fourth portion to be separated from the third portion; and
    repeating moving and applying the pre-determined force to remaining portions of the photovoltaic material until remaining portions have been exhausted,
    wherein the plurality of photovoltaic strip regions are parallel to each other.

36. The method of claim 1
wherein a support material comprises an oblique side surface, and
wherein the applying the pre-determined force along the second portion comprises applying the pre-determined force along the second portion to cause the second portion to be separated from the first portion and slide down the oblique side surface of the support material.

37. The method of claim 35 wherein the positioning the photovoltaic material comprises positioning the photovoltaic material such that the first portion is positioned above a top surface of the support material and is supported by the support material and the second portion positioned above the oblique side surface of the support material but is not supported by the oblique side surface of the side surface.

* * * * *